United States Patent [19]
Lee

[11] 3,973,136
[45] Aug. 3, 1976

[54] CHARGE COUPLED DISPLAY DEVICE

[76] Inventor: William W. Y. Lee, 8451 Sedan Ave., Canoga Park, Calif. 91304

[22] Filed: Sept. 16, 1974

[21] Appl. No.: 506,425

Related U.S. Application Data

[63] Continuation-in-part of Ser. No. 412,487, Nov. 2, 1973, abandoned.

[52] U.S. Cl. ............................ 307/221 D; 307/304; 313/500; 340/166 EL; 357/17; 357/24
[51] Int. Cl.² .......................................... H01L 33/00
[58] Field of Search ...... 340/166 EL, 168 S, 324 M; 357/24, 17; 307/221 D, 304

[56] References Cited
UNITED STATES PATENTS

| | | | |
|---|---|---|---|
| 3,676,715 | 7/1972 | Brojdo | 357/24 |
| 3,792,322 | 2/1974 | Boyle et al. | 357/24 |
| 3,792,465 | 2/1974 | Collins et al. | 357/24 |

*Primary Examiner*—William D. Larkins
*Attorney, Agent, or Firm*—Blakely, Sokoloff, Taylor & Zafman

[57] ABSTRACT

A charge coupled display device for providing a visual image in response to electrical signals applied thereto. The display device preferably utilizes a plurality of charge coupled lines each arranged and controlled so as to operate generally as a shift register, with each of the lines representing one line of the display. Each location in each charge coupled line is caused to contain a charge representative of the image intensity at that point by stepping the charges sequentially along the line from the side, putting in the desired charge for each point in the image. The charge coupled device utilizes buried channels, and upon proper pulsing of the charge coupled device electrodes and the PN junction at the interface of the buried channels, minority carriers are injected from the substrate into the layer of semiconductor material at the surface, which upon recombination with majority carriers, will create an emission at that point proportional to the charge that was stored in the charge coupled device location.

15 Claims, 13 Drawing Figures

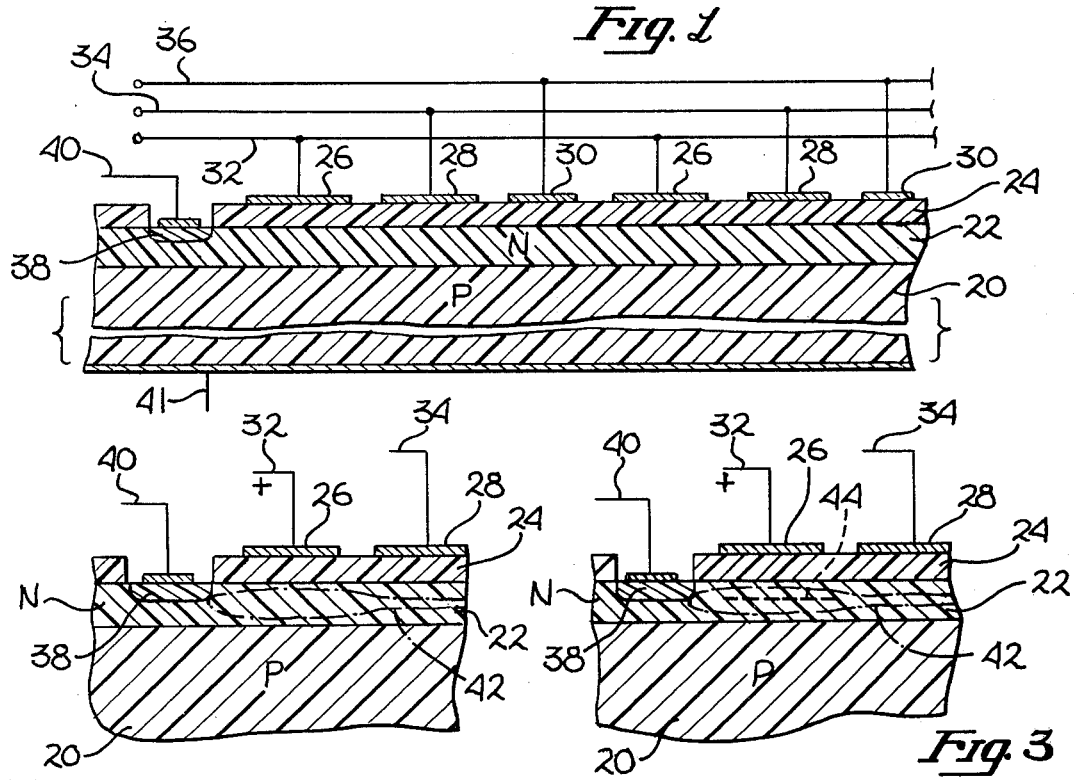
Fig. 1
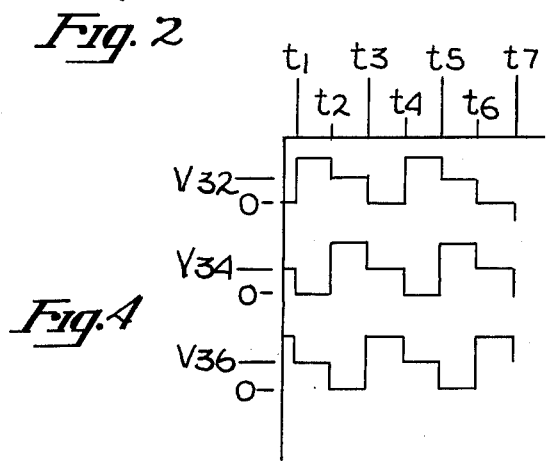
Fig. 2
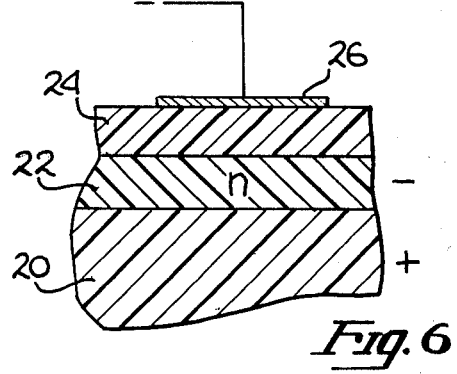
Fig. 3
Fig. 4
Fig. 6
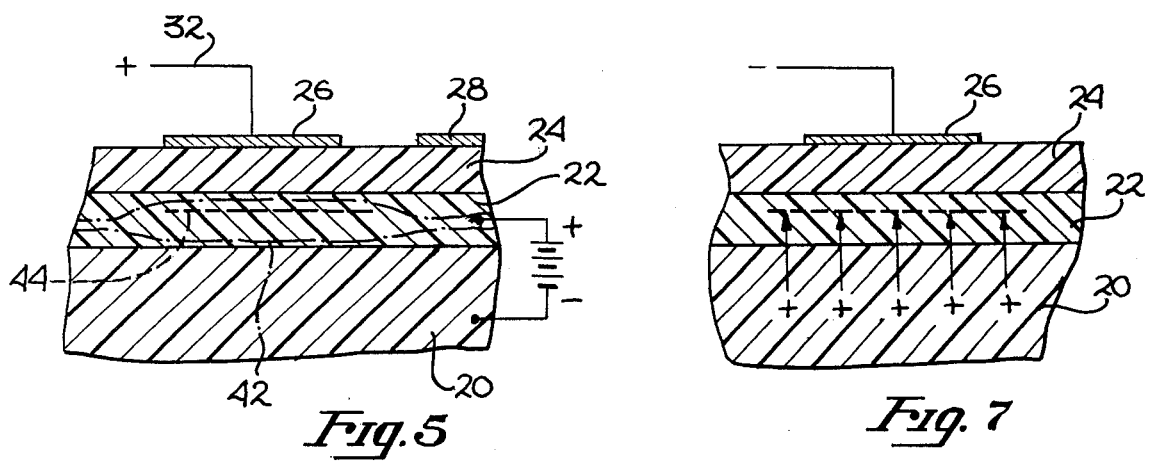
Fig. 5
Fig. 7

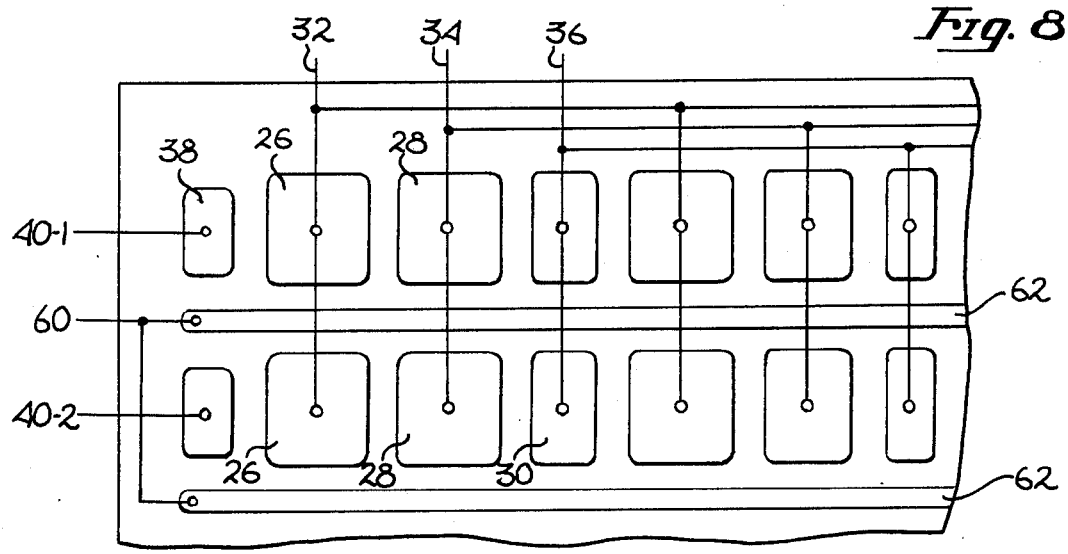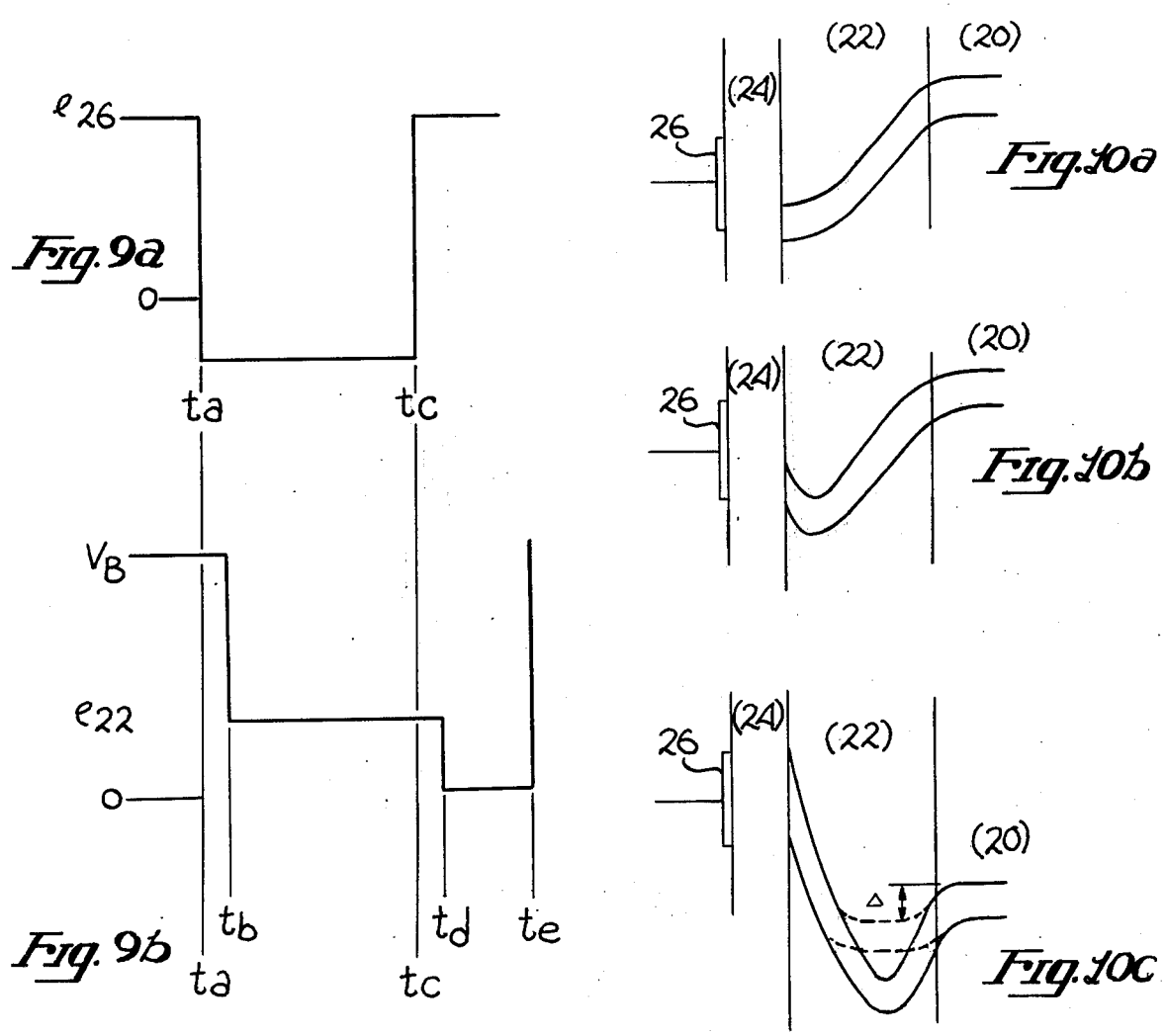

CHARGE COUPLED DISPLAY DEVICE

This is a continuation in part application of Ser. No. 412,487, filed Nov. 2, 1973, now abandoned.

BACKGROUND OF THE INVENTION

1. Field of the Invention

The present invention relates to image display devices and particularly to solid state image display devices for providing two dimensional image displays in response to electrical signals applied thereto.

2. Prior Art

The present invention is a two-dimensional solid state display device which may be used for alpha-numeric displays or for the picture display in a television type device. Accordingly, the prior art relating to this type of display shall be discussed, though it is to be understood that the present invention has many other applications beyond those specifically mentioned therein.

There are three general types of display devices which are often considered, two of which have found widespread application. The first type of display device is a device having a limited number of areas of predetermined geometry and arrangement which may be caused to effectively create a light pattern, either by effecting light transmission (liquid crystal devices) or more commonly by emitting light due to some phenomenon (light emitting diode display devices etc.). Most of this type of display is used for the display of numeric information, and the display consists of either ten signal inputs, any one of which will cause the display of the numeral zero through nine, or will consist of seven segment arrangement in a block-eight form so that activation of various combinations of the seven segments will display the numerals zero through nine as desired. This type of display, utilizing various phenomenon, is fairly well developed and many types of devices are readily commercially available at a reasonable cost. The display, however, is extremely limited in the type and amount of information which may be displayed, and is typically limited to numbers of a fixed size such as may be used, by way of example, on digital read-out test equipment.

The second type of display device is a cathode ray tube, which is the only type of general capability two-dimensional display device which has found widespread application. This type of device may be used to display such things as alphanumeric information, time varying signals and pictures by the controlled deflection of an electron beam impinging upon a surface which will emit light in response to the electron beam, (or by the controlling of the electron beam deflection together with the intensity of the beam as in picture tubes for television sets). The cathode ray tube has the advantages that it may be produced for a reasonable price, electronically has a short time response, may be used to provide colors, and provides an image of good detail of any reasonable size required. It has the disadvantages, however, characteristic of a vacuum tube devices, that is, it requires a heated cathode and requires a high voltage source, not merely a few hundred volts, but on the order of 10,000 to 30,000 volts, and utilizes a rather large glass envelope.

The third type of display not yet finding commercial application is a solid state area display which would compete with the cathode ray tube in at least some applications. Many possibilities exist for such displays such as by way of example, a large array of light emitting diodes, each separately controlled so as to provide the image of the required resolution. Two problems exist with this type of display. First, the cost of such a light emitting diode array at the present time and even accounting for reasonable improvements in the state of the art, would be prohibitive. Secondly, the interconnection and addressing requirements, and, the support circuitry for the array, would be extremely complex and expensive. The technique, however, would have the advantage that each element in the array could theorectically be activated essentially continuously so that the present state of the art in emission intensity from such a device would probably be adequate.

Other techniques have been suggested, such as by way of example, the utilization of an array of some type of luminescent device arranged in rows and columns, with each location in the array being addressable to the respective row and column address line for that point in the array. While this type of system is consistent with the addressing techniques used in solid state random access memories and requires little support circuitry, it has the inherent disadvantage that each point in the array is activated a small portion of the time, so that the instantaneous brightness capability of the emitting device must be very high, typically greatly exceeding the present state of the art.

There is therefore a need for a simple solid state image display device which may be used to display two-dimensional images and which requires a minimum of support circuitry to provide a high quality two-dimensional image in response to electrical signal inputs at a reasonable total system cost.

BRIEF SUMMARY OF THE INVENTION

A novel structure of light emitting avalanche MIS transistor is proposed, which, when used in conjunction with the CCD principle, can provide a practical system for continuous image display.

The device operates in two basic modes. When operated in the charge transit mode, the principle of operation is identical to that of a buried layer CCD. In the display mode, the device is biased such that minor carriers proportional to the charge stored are injected from the substrate, and their subsequent recombination gives rise to light emission.

Recombination resulting in the emission may be in the semiconductor layer itself, which normally will be an epitaxial or implanted layer, in which event the wave length of the emission will be determined by the energy gap of the semiconductor material. As an alternative, recombination might be caused to occur in the insulating layer above the semiconductor material, in which case the characteristics of the insulating material would determine the emission wave length. In any event the emission from most structures is approximately monochromatic and may or may not be in the visible spectrum. If not in the visible spectrum an image convertor may be used to convert the image to a visible image. Also color images are possible by way of example, by utilizing patterns of different materials to create the primary colors at each point.

BRIEF DESCRIPTION OF THE DRAWINGS

FIG. 1 is a cross sectional view of one embodiment of the present invention;

FIG. 2 is a view similar to FIG. 1 illustrating the depletion region after a charge has been stored in the depletion region;

FIG. 3 is a view similar to FIG. 2;

FIG. 4 is a wave form diagram illustrating suitable wave forms for the signal applied on lines 32, 34 and 36;

FIG. 5 is a view similar to FIG. 2 illustrating the voltages on the various elements prior to flashing of the picture;

FIG. 6 is a view similar to FIG. 5 illustrating the pulse change in voltages on some of the plates and the injection of minority carriers into layer 22;

FIG. 7 is a view similar to FIG. 6 illustrating the recombination of the minority carriers in layer 22;

FIG. 8 is a schematic representation of a top view of an area array utilizing the principles of the present invention;

FIGS. 9a and 9b present typical wave forms for the gate voltage and PN junction voltage wave forms to accomplish flashing.

FIGS. 10a through 10c depict energy diagrams for various stages of operation of the present invention.

DETAILED DESCRIPTION OF THE INVENTION

The present invention is a charge coupled display device which comprises preferably a plurality of lines of charge coupled devices whereby a linear distribution of charge representative of a line of the picture to be displayed may be stored in each location of the line, and means for causing the injection of minority carriers across a PN junction responsive to the charge stored at the location so as to emit light upon recombination in an amount responsive to the charge initially stored at that location.

Before describing in detail the preferred embodiment of the present invention, a simpler linear embodiment will first be described. This embodiment, while having application either alone or together with a second dimension sweep apparatus, such as a mechanical sweep mechanism to provide a two dimensional image display system, is also functionally representative of one line in a multiple line two-dimensional display device, which shall hereafter be more fully described.

The general principles of one embodiment of the present invention may be illustrated with respect to FIG. 1. This FIGURE is a cross-section illustrating a portion of a line on the image device. A semiconductor substrate 20 is provided, which for purposes of specificity shall be assumed to be a P-type substrate. A layer 22 of opposite conductivity type over the substrate 20 is provided, preferably having a thickness in the range of 3,000 angstroms to 30,000 angstroms with 5,000 angstroms being most preferred, and providing a PN junction therebetween. Over most of the layer 22 is provided an insulating layer 24 over which a plurality of plates are formed to provide the required electric field to maintain and physically advance the stored charges thereunder. In the specific embodiment shown, a plurality of plates, 26, 28 and 30 are provided coupled to lines 32, 34 and 36 respectively. Thus, in this embodiment a three wire drive field scheme is utilized, though it is to be understood that other drive field schemes known in the prior art of charge coupled devices may also be utilized. At one end of the line a means is provided for injecting carriers into buried channel 22 as the basic input to the charge coupled device line, which in the embodiment illustrated in FIG. 1 is an N+ type region 38 and coupled to line 40. It is to be understood, however, that any of the well known means of providing an input, that is, the injection of carriers into buried channel, may be utilized. To complete the electrical connection to the device of FIG. 1 a connection 41 to the substrate 20 is provided, as well as a connection to the N type layer 22 (not visible in FIG. 1).

The purposes of the structure illustrated in FIG. 1 and the general method of operation thereof are best illustrated by describing an operating cycle with respect to that structure whereby a single frame of the image is created. Obviously, by repetition of the sequence about to be described, successive frames of the image may be flashed at a sufficient rate to create the visual impression of a continuously existent image. Thus, as is suggested from the foregoing, a charge distribution is established through the charge coupled devices to provide an electrical analog of the picture to be displayed. Then the device is pulsed to result in an emission at each point (small area) of the array dependent upon the charge previously stored at that location to flash an individual frame of the picture. Accordingly, contrary to a cathode ray tube wherein the picture is effectively repetitively drawn by a single electron beam (or in the case of color by three electron beams) the picture frame is flashed in much the same manner as is done by a moving picture projector.

To establish the charge distribution representative of the desired picture, layer 22 would be biased positively with respect to substrate 20 so as to back bias the PN junction therebetween.

The combined effect of the PN junction bias and the gate pulse is to keep the silicon surface almost at the same potential level as that of the P type substrate and a deep potential valley is created within the N-layer, which is maintained in depletion primarily by the extent of back biasing of the PN junction.

Line 32 is provided with a positive voltage, typically less positive than layer 22, (which together with an appropriate voltage on gates), will create a lateral potential valley in the buried channel 22 thereunder. This lateral potential valley, at least initially, is relatively free of charge carriers and will generally overlap the edges of adjacent plate 28 and 38, as can be seen in FIG. 2. Accordingly, by control of line 40 while line 32 has the positive voltage thereon, carriers, in this example, electrons may be injected into the potential valley. The same field which creates the potential valley also maintains the injected carriers near the central portion of the potential valley within the bulk of the N layer. Thus, by the control of line 40 in a manner well known in the art of charge coupled devices, the potential valley in the N-layer may be provided with a controlled arrangement of carrier charge 44.

If line 34 is then driven more positive, and the positive voltage on line 32 is decreased, the deeper portion of the potential valley now shifts from under plate 26 to a position under plate 28. Stored charges under plate 26 will now tend to flow into the deeper potential voltage under plate 28. By a three phase manipulation of the potentials of the lines, stored charges can be transferred from under one plate to the next plate. Sequentially repeating the process as is well known in the art of charge coupled devices, the carrier charge injected from one end of the charge coupled device line may be stepped across the line until each location along the line is caused to have a carrier charge representative of the intensity of light to be created at that location.

Accordingly, it may be seen that each line in an area array is loaded with a charge representative of a specific location in the picture from one side of the array and stepped across the array to the proper location. (While a three phase system has been disclosed, it should be understood that other systems may be used, such as, by way of example, two phase systems.)

In an area array, that is, an array made up of a plurality of such lines of charge coupled devices as shown in FIG. 1, the array charge distribution may be created either entirely sequentially by loading first the first line, then the second line, then the third line etc. Such a manner of loading the charges into the array is probably most compatible with contemporary signal transmission systems, as current systems generally transmit point to point information as opposed to simultaneous transmission of a full line of information. As an alternative, however, a signal may be used, or a signal conditioned to simultaneously provide control information for each of the plurality of lines so that all lines may be loaded with the charges representing the picture simultaneously. Such a method decreases the percentage time required for loading the array, resulting in an increase in average intensity of the picture achieved, and further makes the loading (but not the signal conditioning) easier since lines 32, 34, and 36 for all of the plurality of charge coupled device lines may be controlled in unison rather than sequentially (e.g. all of lines 32 may be common, all of lines 34 common etc.)

In further explanation of the foregoing, a typical wave form for the signals on lines 32, 34 and 36 may be seen in FIG. 4. Basically, the voltages on each line vary in three steps, and the depth of the potential will under the plates thus energized vary approximately in a proportionate manner. Between time T1 and T2, the charge may be loaded into a particular line. However, at time T2, when the signal on line 34 is driven positive the deepest portion of the potential valley moves to a position under the next adjacent plate, completing its transition to that plate at time T3, so that the charge loaded between time T1 and T2 is advanced one place along the charge coupled device line. Similarly, between time $T_3$ and $T_4$, the charge is advanced by one additional plate so that a repetition of the wave form shown in FIG. 4 a predetermined number of times will sequentially advance the charges along the charge coupled line to fill that line. It should be noted that an unequal drive always exists on at least one of lines 32, 34 and 36, during loading which will maintain the stored charges under plates 26, 28 or 30 respectively. (The voltage range of the plates typically is from ground to a voltage less than the voltage of the N layer, but reasonable negative plate voltages are not impermissible.)

The formation of the potential well (valley) and the storage of charges may be further illustrated by the energy band diagrams under one of the plates, as shown in FIGS. 10a through 10c. FIG. 10a illustrates the theoretical situation when the plate 26 is floating (uncharged) and all the N-region is depleted due to the bias across the PN junction. When a potential smaller than that on region 22 is applied on the gate, the potential at the insulator-semiconductor interface is pulled down and a deep potential well is formed in the buried layer region (as is shown in FIG. 10b). The depth of the potential minimum can be altered by changing surface potential at the silicon-oxide interface. When the charges are stored in the well, the energy band is represented by the dashed lines in the figure.

Once the array of storage locations is caused to contain the charge representing the intensity of the illumination to be created at that point, the image is ready for flashing (e.g. strobing). Prior to flashing, the plate or plates under which the charge 44 is stored, such as plates 26 as shown in FIG. 5, are positive, and region 22 is maintained positive with respect to both plate 26 and the substrate 20. To flash the picture, the plates under which the charge is stored, such as in the example, all of plates 26, are suddenly driven negative by driving all of lines 32 negative, as shown in FIG. 6, and slightly later the high reverse bias of the PN junction between layer 22 and the substrate 20 is replaced with a smaller reverse bias (or possibly a very small forward bias not exceeding a fraction of the difference in the Fermi levels of the two regions) across the PN junction.

The pulsing sequence on lines 26 and 22 with respect to region 20 is shown in FIGS. 9a and 9b. The energy diagram of a storage bucket during flashing is depicted in FIG. 10c. A sufficiently negative voltage is applied on the plate 26 so that the deep depletion boundary approaches the junction. The reverse bias across the PN junction can now be decreased at will, and, as long as the potential in the PN region is higher than the electron level, the original electron charge will be contained during and after the onset of the flashing made. If this energy differential, designated in the diagram as $\Delta$, is made sufficiently small by biasing the PN junction at a certain set value, holes will be injected across this barrier $\Delta$, proportional to $e^{-\Delta/kT}$ After the holes diffuse through a short distance of relatively field free region, they are accelerated toward the semiconductor insulator interface by the field in the deep depletion region (depletion now being maintained by the plate voltage). At this stage, their velocity may be great enough to produce avalanching, depending on the voltage on plate 26. If the bucket is empty, the above described injection of holes will not occur because $\Delta$ is too large for the same PN junction bias voltage. In this manner it is seen that the hole current toward the silicon-oxide interface produces a spatial pattern similar to that of the original electron buckets. Thus charge amplification results in a manner very similar to the current amplification in a junction transistor, with the extent of charge and the PN junction bias in each well adjacent the PN junction together being comparable to the base emitter voltage of a junction transistor. Recombination and/or injection of the electrons into the P region with time increases the barrier $\Delta$, decreasing the hole injection with time toward a quiescent value.

Thus at time $T_b$ the voltage applied across the PN junction would normally be stepped to a predetermined level, that is a level determined to result in the desired minority carrier injection/storage charge relationship. Obviously, adjustment of this voltage within a reasonable range may be used as an adjustment in this relationship, and this adjustment together with an adjustment in the gain of the signal utilized to load each charge coupled device line, and the addition of a "DC" level on each charge coupled device location may be used as automatic or manually adjustable control for image intensity and contrast.

It is important to note that the control action of the stored electron is due to the change of barrier height of the PN junction. The injected holes being an exponential function with respect to the barrier height, a great amount of amplification of the original signal results. The entire device when operated in this mode in fact is a gigantic bipolar transistor with the semiconductor surface as a collector.

The wave forms for the plates 26 and for the N layer 22 with respect to the substrate are illustrated in FIGS. 9a and 9b. It is to be noted that during the CCD mode, plates 26 are positive and the PN junction is heavily back biased. This back biasing depletes the N layer 22. At time $T_a$ the plate voltage is driven negative so as to shift the energy well toward the PN junction and aid in maintaining the N layer in depletion. At time $T_b$ the heavy back biasing is replaced with a much smaller back bias on the PN junction. Normally this would eliminate the depletion of the N region. However the high negative voltage level applied to the plates 26 maintains the depletion in the N region and the carriers injected (holes) across the PN junction are encouraged toward the oxide N layer interface by the field thereon. The voltage on plates 26 is returned to a high positive level at time $T_c$ which may be the same as or different from that prior to time $T_a$. This recovers the fields, causing accumulation of the N layer, providing excess electrons for recombination (emitting light upon recombination) with whatever holes have been injected through the PN junction, as may be increased as a result of avalanching in the N region. At time $T_d$, after flashing, the PN junction is biased to dump the remaining electrons in the energy well. Finally, the PN junction is again back biased at $T_e$ and plates 26, 28 and 30 are again operated at the normal CCD mode voltages in preparation for the flashing of the next frame.

According to the present invention, a new element, the vertical bipolar transistor with a surface barrier as the collector coupled with the MIS luminescent device, is introduced. For greater injection efficiency, the P substrate should be heavily doped, e.g. in the $10^{17} - 10^{18}$ /cc range, and the N layer should be lightly doped ($10^{14} - 10^{15}$ /cc) so that it can be depleted easily. Thus, the relative concentration ratio should be at least 100 to 1, and more preferably at least 1,000 to 1, with the substrate being more heavily doped.

The emission, whether or not in the visible spectrum, may be from any of a number of phenomena. By way of example, the injection of the holes from the substrate 20 into the N type layer 22 with recombination of the holes with electrons in the N type layer at the surface is illustrated in FIG. 7. Recombination of the injected holes with the electrons in this manner will result in an emission dependent upon the magnitude of energy gaps. For the most commonly used semiconductor materials however, the wave length of the emission will be in the infrared region so that some infrared image converter means must be utilized such as by way of example, any of the commercially available infrared image converter tubes.

It should be noted from the above description that the result of the structure heretofore disclosed is the injection of minority carriers into the layer 22, with recombination in this layer at the surface being the source of emission. The brightness and other characteristics of the image may be improved by taking advantage of the fact that one may normally induce avalanche in the semiconductor material in an MIS type structure (or more generally a conductive gate insulator semiconductor structure) by applying a step voltage to the conductive plate of sufficient amplitude and abruptness so as to cause avalanching in the semiconductor material. This results for the reason that the time constants governing build-up of an inversion layer in semiconductors are very long. Avalanche and/or tunneling occurs because the thermal build-up of minority carriers is too slow and when the pulse voltage is increased, band bending reaches large values where the minority carriers are generated by nonthermal effects. In the present invention minority carriers in layer 22 are injected across PN junction, and this nonthermal source of minority carriers can be used as a control source of minority carriers to control the onslaught and extension of avalanche induced in layer 22 by an appropriate voltage pulse wave form on the plates 26. Accordingly, characteristics such as efficiency, brightness and contrast may also be controlled and improved by control of the pulse shape and amplitude on the plates controlling flashing.

It should be noted that since the surface transfer mechanism is through a buried channel in bulk silicon rather than a surface channel, the transfer inefficiency and noise of the device are much less susceptible to the presence of fast states at the semiconductor insulator interface. This points to the feasibility of using semiconductor insulator combinations other than Si—SiO$_2$, which may give desirable light emission characteristics such as by way of example GaP which would yield light in the visible region, but the interfacial state density between GaP and SiO$_2$ would be so high as to make a surface channel device impractical.

There are some semiconductor materials for which large diameter single crystal pieces cannot be readily grown, and yet the use of such materials is desired for the reason that recombination within the material results in the emission of light of a particularly desired wave length. By way of specific example, red and green emission has been observed from SiO$_2$ — ZnO structures. Accordingly, application of such materials in the present invention might be made by growing an epitaxial thin layer of the material on silicon slices of the opposite conductive type. In other words, a hetrojunction is formed. By way of specific example, a display device emitting visible light can be made from a structure of GaP on silicon.

In another embodiment of this invention, the recombination can take place in the insulator layer 24, so that the emitted light will be characteristic of the band gap of the insulator. The injected and avalanching as described earlier, may have sufficient energy to overcome the barrier at the interface and pass on to the valence band of the insulator. In the meantime, electrons can be injected from the gate and recombine with the holes. This scheme has the advantage that a visible image device can be made from silicon substrates, and since the wavelength of light is characteristic of the insulators used, images in natural color can be formed by using alternate patterns of three different kinds of insulation under the storage gates.

Since emission occurs near the top surface of the device, the best visibility of the emission and pattern or picture created thereby is by viewing the device from the top face, in which case a transparent conductor for the various plates 26, 28 and 30 are used for those plates under which emission will occur. In the preferred embodiment, plates fabricated of SnO$_2$ or a mixture of SnO$_2$ + InO provide the desired transparency.

A typical structure for a complete array is illustrated in FIG. 8, which is a schematic top view of a corner of a larger array. It may be seen that the plurality of plates 26, 28 and 30 are coupled to lines 32, 34 and 36 respectively. Injection plates 38 are coupled to line 40-1, 40-2, etc., to provide the basic charge injection control for each of the plurality of lines in the array. In this particular embodiment, the additional lines 60 are provided for making a basically linear contact through regions 62 across the width of the array with the layer 22 (see FIG. 1) to provide direct coupling to the surface layer of semiconductor to provide the controlled voltage across the PN junction as hereinbefore described. (Regions 62 may be metallized regions or diffused regions of increased conductivity). Also provided but not shown in the FIGURE is an electrical connection to the substrate itself, typically through a metallized back face so as to complete the connections to the substrate for control of the voltages on the various elements thereof.

There has been described herein a solid state image display device wherein charge coupled principles are utilized to provide stored charges representative of the intensity of emission desired at the respective location. Obviously, the principles of the present invention are also applicable to devices fabricated with opposite conductivity type materials. A PN junction is utilized for injection of the minority carriers across the junction, and on recombination of the minority carriers so injected, the emission of light in response to the injected carriers is achieved. While single color emissions (or white emission) is the most readily achieved emission, a color image could be provided by arranging large coupled lines in groups of three, each having a control input representing the respective primary color to be created by that light, and each having emission occuring in a different material selected for the desired wave length of emission upon recombination within that material. Thus, white the present invention has been disclosed and described with respect to a preferred embodiment thereof, it will be understood by those skilled in the art that various changes in form and detail may be made therein without departing from the spirit and scope of the invention.

I claim:

1. A method of providing controlled emission comprising:
    a. providing a charge coupled device having a substrate with at least a first surface layer of a first conductivity type forming a PN junction with said substrate, a second insulative layer over said first layer, a plurality of charge coupled device control plates over said second layer, and an injection means for controllably injecting majority carriers into said first layer adjacent one of said plurality of control plates;
    b. providing a reverse bias on said PN junction for the back biasing thereof;
    c. simultaneously controlling said control plates and said injection means to result in a storage of majority carriers adjacent said PN junction at a plurality of control plate locations so that each location obtains a charge dependent upon the desired intensity of emission at that location, said majority carriers being maintained in depletion regions by a first substantial voltage on the respective control plates with respect to said substrate having a polarity opposite that of the charge of the majority carriers, and
    d. changing the control plate voltage with respect to the substrate to a second substantial voltage of the same polarity as the stored carriers and of sufficient amplitude to cause the injection of substrate majority carriers across said PN junction and into said first layer in a quantity controlled by the charge stored at each respective control plate location to cause light emission.

2. The method of claim 1 wherein said second substantial voltage is of sufficient amplitude to cause avalanche breakdown in said first layer responsive to the quantity of injected carriers.

3. The method of claim 1 wherein said light emission is caused to occur in a region above said substrate.

4. The method of claim 3 wherein said light emission is caused to be emitted in said first layer.

5. The method of claim 1 wherein at least some of said control plates of said charge coupled device are substantially transparent to a predetermined wave length of light and wherein said light emission is caused to occur in a region above said substrate.

6. A method of providing controlled emission comprising:
    a. providing a charge coupled device having a substrate with at least a surface layer of a first conductivity type forming a PN junction with said substrate, a second insulative layer over said first layer, a plurality of charged coupled device control plates over said second layer, and an injection means for controllably injecting majority carriers into said first layer adjacent one of said plurality of control plates;
    b. providing a reverse bias on said PN junction for the back biasing thereof;
    c. simultaneously controlling said control plates and said injection means to result in a storage of majority carriers adjacent said PN junction at a plurality of control plate locations so that each location obtains a charge dependent upon the desired intensity of emission at that location, said majority carriers being maintained in depletion regions by a first substantial voltage on the respective control plates with respect to said substrate having a polarity opposite that of the charge of the majority carriers, and
    d. changing the control plate voltage with respect to the substrate to a second substantial voltage of the same polarity as the stored carriers and of sufficient amplitude to cause avalanche breakdown in said first layer responsive to the quantity of injected carriers. predetermined 7. A method or providing controlled emission comprising the steps of:
    a. providing a buried channel charge coupled type device having a substrate, a first surface layer of a first conductivity type forming a PN junction with said substrate, a controllable majority carrier injection means, an insulative layer and a plurality of charge coupled control plates, said insulative layer and at least some of said control plates being substantially transparent to a predetermined wave length of emission;
    b. operating the device in the charge coupled device mode with the buried channel reverse biased to store majority carriers in depletion regions under a plurality of control plates in concentrations dependent upon the desired emisssion at that point, with the respective control plates having a first substantial voltage of a first polarity; and c. changing the voltage across the PN junction under said control plates to a value approximately equal to the forward conduction threshhold voltage and dependent upon the quantity of the stored charge under each respective said control plates to cause the injection of substrate majority carriers across said PN junction and into said first layer in a quantity controlled by the charge stored at each respective control plate location to cause light emission.

8. The method of claim 7 wherein said second substantial voltage is of sufficient amplitude to cause avalanche breakdown in said first layer responsive to the quantity of injected carriers.

9. The method of claim 7 wherein said light emission is caused to occur in a region above said substrate.

10. The method of claim 9 wherein said light is caused to be emitted in said first layer.

11. A display device comprising:
 a. a charge coupled device having a substrate with at least a first surface layer of a first conductivity type forming a PN junction with said substrate, a second insulative layer over said first layer, a plurality of charge coupled device control plates over said second layer, and an injection means for controllably injecting majority carriers into said first layer adjacent one of said plurality of control plates;
 b. means for providing a reverse bias on said PN junction for the back biasing thereof;
 c. means for simultaneously controlling said control plates and said injection means to result in a storage of majority carriers adjacent said PN junction at a plurality of control plate locations so that each location obtains a charge dependent upon the desired intensity of emission at that location, said majority carriers being maintained in depletion regions by a first substantial voltage on the respective control plates with respect to said substrate having a polarity opposite that of the charge of the majority carriers; and
 d. means for changing the control plate voltage with respect to the substrate to a second substantial voltage of the same polarity as the stored carriers and of sufficient amplitude to cause the injection of substrate majority carriers across said PN junction and into said first layer in a quantity controlled by the charge stored at each respective control plate location to cause light emission.

12. The display device of claim 11 wherein said substrate has dopant impurity level of at least one hundred times the dopant impurity level of said first layer.

13. The display device of claim 11 wherein at least some of said control plates are substantially transparent to said light emission.

14. A display device comprising:
 a. a buried channel charge coupled type device having a substrate, a first surface layer of a first conductivity type forming a PN junction with said substrate, a controllable majority carrier injection means, an insulative layer and a plurality of charge coupled control plates, said insulative layer and at least some of said control plates being subtantially transparent to a predeteremined wave length of emission;
 b. means for operating the device in the charge coupled device mode with the buried channel reverse biased to store majority carriers in depletion regions under a plurality of control plates in concentration dependent upon the desired emission at that point, with the respective control plates having a first substantial voltage of a first polarity; and
 c. means for changing the voltage across the PN junction under said control plates to a value approximately equal to the forward conduction threshhold voltage and dependent upon the quantity of the stored charge under each respective said control plate to cause the injection of substrate majority carriers across said PN junction and into said first layer in a quantity controlled by the charge stored at each respective control plate location to cause light emission.

15. The display device of claim 14 wherein said first substrate has a dopant impurity level of at least one hundred times the dopant impurity level of said first layer.

* * * * *